United States Patent
Rangarajan et al.

(10) Patent No.: US 6,238,830 B1
(45) Date of Patent: May 29, 2001

(54) ACTIVE CONTROL OF TEMPERATURE IN SCANNING PROBE LITHOGRAPHY AND MASKLESS LITHOGRAPY

(75) Inventors: Bharath Rangarajan, Santa Clara; Michael K. Templeton, Atherton; Bhanwar Singh, Morgan Hill, all of CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/429,994

(22) Filed: Oct. 29, 1999

(51) Int. Cl.[7] .................................................. G03F 9/00
(52) U.S. Cl. .......................................... 430/30; 250/492.2
(58) Field of Search ........................... 430/30; 250/458.1, 250/459.1, 492.2

(56) References Cited

U.S. PATENT DOCUMENTS

| | | | |
|---|---|---|---|
| 5,504,338 | 4/1996 | Marrian et al. | 250/492.2 |
| 5,618,760 | 4/1997 | Soh et al. | 438/703 |
| 5,784,157 | 7/1998 | Gorfinkel et al. | 356/318 |

*Primary Examiner*—Christopher G. Young
(74) *Attorney, Agent, or Firm*—Eschweiler & Associates, LLC

(57) ABSTRACT

A system for monitoring and regulating a photoresist temperature in a maskless lithography pattern transfer process is disclosed. The system includes a photoresist layer overlying a substrate and a material associated with the photoresist layer, wherein the material exhibits a transformation over variations in temperature. The system also includes a detection system for detecting the transformation in the material and a processor operatively coupled to the detection system. The processor receives information associated with the detected transformation and uses the information to control a tool being used for the pattern transfer, thereby reducing variations in temperature in the resist during pattern transfer. In addition, a method of monitoring and regulating a photoresist temperature in a maskless lithography pattern transfer process is disclosed. The method includes associating a material having a characteristic which varies over variations in temperature with a photoresist layer which overlies a substrate and detecting the characteristic during the pattern transfer process. Once detected a temperature of a portion of the photoresist layer is determined using the detected characteristic and an operation of a writing tool which performs the pattern transfer process in response to the photoresist layer temperature is controlled in response thereto.

37 Claims, 7 Drawing Sheets

Fig. 4

ACTIVE CONTROL OF TEMPERATURE IN SCANNING PROBE LITHOGRAPHY AND MASKLESS LITHOGRAPY

TECHNICAL FIELD

The present invention generally relates to semiconductor processing, and in particular to a system and method for monitoring and controlling the temperature within a photoresist in conjunction with a maskless lithography process.

BACKGROUND OF THE INVENTION

In the semiconductor industry, there is a continuing trend toward higher device densities. To achieve these high densities there has been and continues to be efforts toward scaling down the device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, etc.) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist, nonuniform heating of the photoresist during pattern formation can negatively impact the goal of achieving uniformity in the critical dimensions of various features. Small changes in the time/temperature history of the photoresist can substantially alter image sizes, resulting in lack of image line control. A uniform time/temperature history of the photoresist is especially important with chemically amplified photoresists because image size control may be drastically affected by only a few degrees difference in temperature. This is because a substantial portion of the exposure reaction in such resists are driven thermally. Therefore if different portions of the resist are being exposed at varying temperature levels, the amount of exposure and therefore the resulting patterns generated subsequently using the resist as a mask will also vary undesirably.

It is therefore desirable to have a system and/or method which substantially reduces or eliminates temperature variations in a resist during the pattern generation process.

SUMMARY OF THE INVENTION

The present invention is directed toward a system and method of monitoring a temperature of the resist during pattern generation and provides dynamic feedback control to one or more writing tools in order to maintain the resist temperature either below a threshold temperature or within a preferred temperature range. According to one aspect of the present invention, the resist is doped with a temperature sensitive material which undergoes a transformation as a function of temperature. For example, such a material may be a temperature sensitive fluorophore which produces fluorescence having a magnitude of which is a function of the resist temperature. The resist temperature is then monitored by monitoring the transformation of the temperature sensitive material within the resist, for example, by monitoring the amount of fluorescence across the resist.

Based upon the in-situ monitoring, the resist temperature may be accurately and quickly ascertained and such temperature data is used to control the one or more writing tools being used in the lithography process. For example, if the temperature at one location in the resist exceeds a predetermined temperature threshold, the write rate of the writing tool at that particular location is reduced to thereby reduce the resist temperature thereat. Correspondingly, if the resist temperature at a location in the resist falls below another predetermined threshold, the write rate of the writing tool at the location may be increased.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 4 is a temperature amplitude table correlating the temperature amplitudes of FIG. 3 with desired values for the temperature amplitudes in accordance with the present invention;

DETAILED DESCRIPTION OF THE INVENTION

Figure 1A:
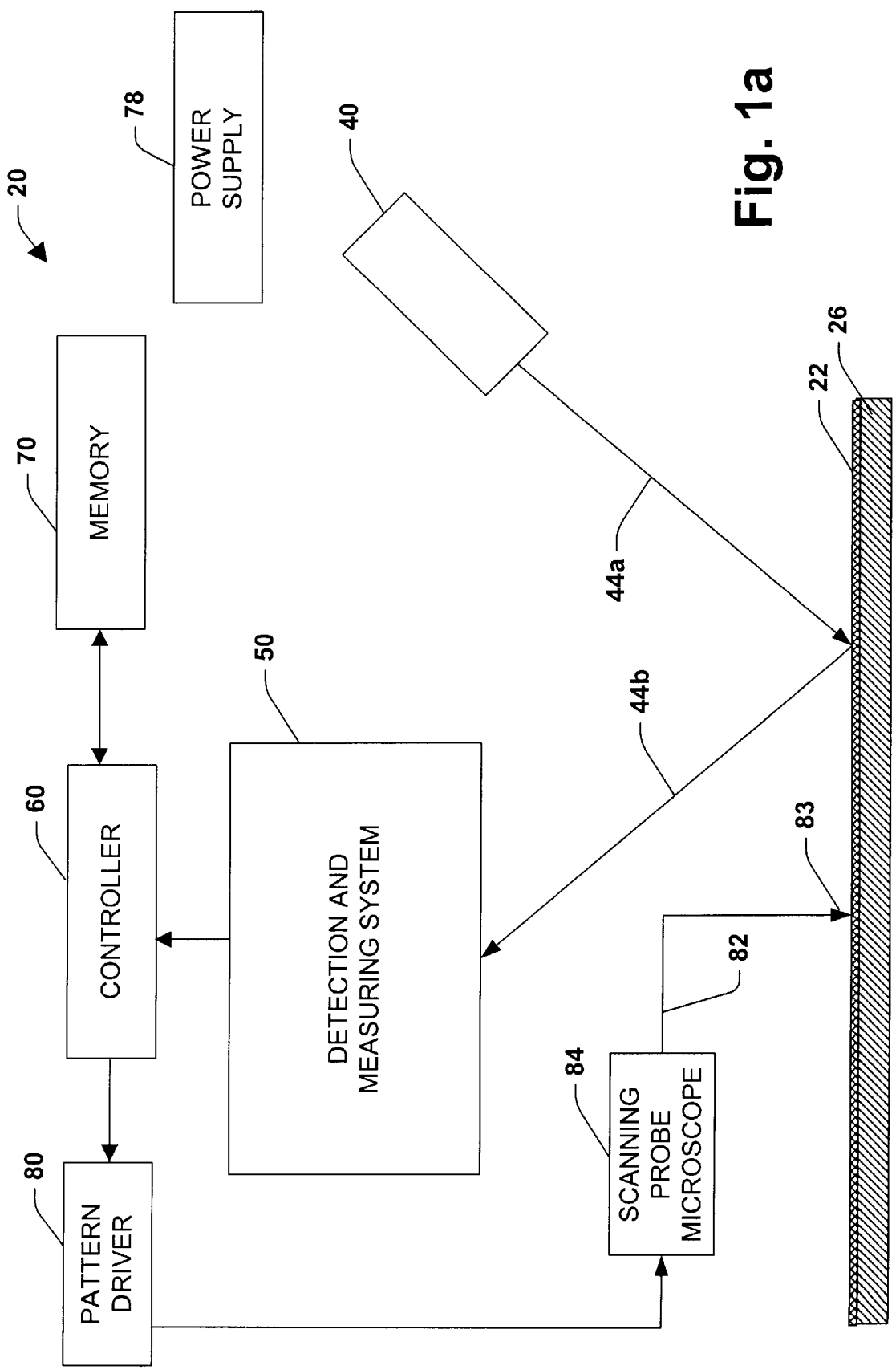
FIG. 1a is schematic block diagram of a maskless lithography system having thermal monitoring and dynamic control in accordance with the present invention.

The present invention will now be described with reference to the drawings, wherein like reference numerals are used to refer to like elements throughout. The present invention will be described with reference to a system for monitoring and controlling the resist temperature during the writing process in which patterns are transferred to the resist. The system and method of the present invention improves resolution by monitoring a material associated with the resist that undergoes a detectable transformation over variations in temperature. The detected transformations are used to determine the resist temperature thereat and resist temperature is used to dynamically control the write rate of a writing tool to thereby maintain the resist temperature to an acceptable level or within an acceptable range.

It was appreciated by the inventors of the present invention that use of maskless-type lithography processes may impact negatively the photoresist being processed because of the writing processes effectuated by the various tools. That is, during a writing step, wherein a desired pattern is transferred to the photoresist, the photoresist temperature will rise. A temperature change in the resist is not necessarily a problem if its impact is predictable and repeatable. Unfortunately, do to a large number of different factors, such as the overall pattern being generated, different portions of the resist heat up in a nonuniform fashion which undesirably results in nonuniformity in the critical dimension of features and alignment. The above problem with nonuniform resist heating may become more acute in massively parallel writing techniques, wherein multiple scanning probes, electron beams or ion beams are utilized simultaneously to generate a desired pattern in a time-efficient manner because the spacing between various probes will differ which may result in temperature disparities across the resist during the pattern generation process.

To help understand the manner in which such maskless lithography tools operate, and thus facilitate an understanding of the problem identified by the inventors of the present invention, a brief description of several maskless lithography techniques will be briefly described below.

One common approach to achieving smaller lithographic resolution uses focused beam lithography with high electron or ion beam energies to obtain a tightly focused spot in which the beam is projected onto a substrate. To form a pattern on a substrate using such a lithographic technique, a suitable substrate is first covered with a thin layer of radiation sensitive material (e.g., a resist). The electron or ion beam exposes, that is, induces a physical change in the resist, and the exposed resist pattern can be developed using a suitable solvent.

For small feature sizes, however, lithographic resolution is not limited by the focus of the beam, but rather is limited by the electron or ion beam scattering in the resist and from the substrate. This scattering causes reduced lithographic resolution and pattern distortions which are commonly referred to as "proximity effects." Such effects are caused by the interaction of the high-energy electrons or ions used in a beam with solid matter such as a substrate or mask surface. Therefore despite use of beams with high energies, scattering still occurs and can limit the lithographic resolution of the resist and therefore other techniques are sometimes used based on the circumstances.

A different maskless approach to achieve higher lithographic resolution over mask-type lithographic processes is to reduce the energy of the electron or ion beam lithography. One type of device which employs this principle is a scanning tunneling microscope (STM) which uses field emission of electrons from an electrode tip. The electrons from the electrode tip pass through the resist down to the substrate to thereby expose the resist. The STM suffers from one disadvantage that current flowing from the tip of the electrode to the substrate (through the resist) is used both to expose the resist and to control the separation between the electrode and the substrate. Since these functions are coupled together, the performance of STM may be limited. More particularly, when using low power (which is desired for exposure), electrode tip control may be lost and the control servo system may push the electrode tip too close to the substrate and into the resist. Consequently, the tip may penetrate the resist and only the resist volume beneath the electrode is exposed.

Another lithographic technique which is "maskless" is scanning or atomic force microscopy (SFM or AFM). SFMs and AFMs have both been used to map or image a surface topography of a sample by scanning a tip over the sample. The tip position is controlled by maintaining a constant force of the tip on the sample, and the deflection of a cantilever to which the tip is attached is monitored to map the surface topography of the sample. For lithography purposes, such tools (collectively referred to as scanning probe lithography) may be used in conjunction with a resist to provide high resolution features. For example, the tip is preferably extremely sharp (e.g., having a radius of curvature on the order of tens of nanometers or less) and is formed of a conductor or a semiconductor. Therefore a voltage and/or current can be passed through the tip to effectuate a physical change in the resist (i.e., expose the resist), which can then be exploited to perform high resolution lithography. By employing a multitude of such tips in conjunction with a controller, a massively parallel writing system may be employed to reproduce a plurality of patterns in the resist in a time-efficient manner.

One adverse characteristic associated with the use of scanning probe lithography (SPL) or other maskless lithography techniques is the rapid temperature rise which occurs in the resist during the pattern generation (i.e., the writing step). As discussed above, nonuniformity in the resist heating will cause nonuniform resist exposure which results in degraded feature resolution and alignment accuracy. It was appreciated by the inventors of the present invention that monitoring and controlling the resist temperature during the pattern generation process is important for accurate critical dimension (CD) control and accurate alignment. Further, it was appreciated that such resist temperature monitoring and control will become increasingly important as the number of writing arms or beams increase, for example, in massively parallel scanning probe lithography systems.

The present invention is directed toward a system and method which monitors the temperature of the resist during pattern generation and provides dynamic feedback control to the writing tool or tools in order to maintain the resist temperature either below a threshold temperature or within a preferred temperature range. According to one aspect of the present invention, the resist is doped with a temperature sensitive material which undergoes a transformation as a function of temperature. For example, such a material may be a temperature sensitive fluorophore which produces fluorescence having a magnitude of which is a function of the resist temperature. The resist temperature is then monitored by monitoring the transformation of the temperature sensitive material within the resist, for example, by monitoring the amount of fluorescence across the resist.

Based upon the in-situ monitoring, the resist temperature may be accurately and quickly ascertained and such temperature data is used to control the one or more writing tools being used in the lithography process. For example, if the temperature at one location in the resist exceeds a predetermined temperature threshold, the write rate of the writing tool at that particular location is reduced to thereby reduce the resist temperature thereat. Correspondingly, if the resist temperature at a location in the resist falls below another predetermined threshold, the write rate of the writing tool at the location may be increased.

Referring initially to FIG. 1a, a maskless lithography system 20 having thermal resist monitoring and dynamic control is shown. The system 20 includes a resist 22 overlying a substrate 26. The resist 22 is deposited over the substrate 26 using any one of various conventional deposition techniques, for example, using a spin-on deposition technique.

According to one exemplary embodiment of the present invention, the resist 20 is doped with a temperature sensitive material which undergoes a transformation as a function of temperature. Various types of temperature sensitive materials may be used and are contemplated as falling within the scope of the present invention. For example, the material may comprise a die which has a color, hue or intensity which is a function of temperature, or the material may exhibit a transparency or reflectivity with respect to a particular type of radiation which is a function of temperature. According to a preferred embodiment of the present invention, however, the material which dopes the resist 22 is a temperature sensitive fluorophore which produces a fluorescence which is a function of temperature.

A fluorophore is a substance which possesses a unique quality of producing light in response to being irradiated. Fluorophores therefore produce light after being excited by radiant energy, and the produced light generally is referred to as fluorescence. Fluorescence occurs when electrons, which have been displaced to excited states by energy absorbed during the irradiation, return to lower energy levels. Energy in the form of electromagnetic quanta is given off when the electrons return to the lower energy levels. Fluorescence begins when the fluorophore is irradiated and ends when irradiation ceases, with a relative short time delay, typically about 0.1–10 nsec. This extremely fast response time allows for monitoring and dynamic control of the writing tool in substantially real time.

According to the present invention, the fluorophore is a temperature sensitive fluorophore, which means that the degree to which fluorescence occurs (i.e., magnitude) is a function of the temperature thereat. Since the fluorophores are dispersed throughout the resist 22 via a doping or a mixing procedure, the temperature of the resist 22 caused by the write rate (i.e., pattern formation rate) of one or more writing tools local to the fluorophores dictates the degree to which fluorescence is detected at that location and reflects the resist temperature thereat when irradiated. Various types of fluorophores may be utilized and are contemplated as falling within the scope of the present invention. For example, some temperature sensitive fluorophores exhibit a variation in fluorescence intensity over temperature while other types of fluorophores (e.g., europium chelates) exhibit a shift in fluorescence wavelength over variations in temperature. This latter type of fluorophore is preferred because detected a shift in radiation wavelength (i.e., color) is easier than a variation in intensity since intensity measurements may require calibration to know the incident calibration intensity, etc. However, any type of temperature sensitive material may be utilized.

The system 20 further includes an excitation source 40 such as a light source which irradiates portions of the resist 22. Although FIG. 1 a illustrates only one such irradiation source for the sake of simplicity, a plurality of sources 40 may be utilized in the system 20 in order to irradiate multiple regions simultaneously, or even all the regions of the resist 20, and such an alternative is contemplated as falling within the scope of the present invention. According to another alternative embodiment of the present invention, a single source 40 may be utilized and moved in conjunction with and under the control of a controller to irradiate various areas of the resist 22, as may be desired.

Radiation, for example, excitation light 44a, is incident on the resist 22. The excitation light 44a triggers a fluorescence 44b from the resist 22 as described above, a magnitude of which is a function of the resist temperature. The fluorescence 44b is detected and processed by a detection and measuring system 50 which measures the magnitude of the fluorescence 44b. Preferably, the measuring system 50 includes one or more photodetectors, however, any mechanism or sensor which is operable to detect a change in the material associated with the resist as a function of temperature may be used and is contemplated as falling within the scope of the present invention. Photodetectors and various detection systems are well known in the art, and therefore further discussion related thereto is omitted for the sake of brevity.

A controller or processor 60 receives the measured data from the measuring system 50 and determines the temperature of respective portions of the resist 22 based on the detected fluorescence magnitude. The controller 60 is operatively coupled to the detection and measuring system 50 and is programmed to control and operate the various components within the maskless lithography system 20 in order to carry out the various functions described herein. The controller or processor 60 may be any of a plurality of processors, such as the AMD Athlon, K6 or other type architecture processors. The manner in which the controller 60 can be programmed to carry out the functions relating to the present invention will be readily apparent to those having ordinary skill in the art based on the description provided herein.

A memory 70 is also included in the system 20. The memory 70 is operatively coupled to the processor 60 and serves to store program code executed by the processor 60 for carrying out operating functions of the system 20 as described herein. The memory 70 includes, for example, read only memory (ROM) and random access memory (RAM). The ROM contains, among other code, the Basic Input-Output System (BIOS) which controls the basic hardware operations of the system 20. The RAM preferably is the main memory into which the operating system and application programs are loaded. The memory 70 also serves as a storage medium for temporarily storing information such as resist temperature, temperature tables, resist coordinate tables, fluorescence information, scanning probe microscope information, and other data which may be employed in carrying out the present invention. For mass data storage, the memory 70 may include a hard disk drive (e.g., 10 Gigabyte hard drive).

A power supply 78 provides operating power to the system 20. Any suitable power supply (e.g., battery, line power) may be employed to carry out the present invention.

The processor 60 is also coupled to a pattern driver 80 which drives one or more writing tools. The writing tools themselves may vary depending upon the type of maskless lithography system. For example, the writing tools may be electron or ion beams or a cantilever and tip arrangement, etc. According to a preferred embodiment of the present invention, the writing tool is associated with a scanning probe lithography system and includes cantilever arms 82 having a tip 83 of a scanning probe microscope 84 such as an SFM or an AFM associated therewith. The pattern driver 80 is controlled by the controller 60 to generate the various patterns and is also controlled to selectively vary the write rate of one or more tips 83 based on the detected resist temperature. The controller 60 is able to monitor the temperature of the various resist portions and selectively and dynamically regulate the temperatures of each resist portion via the pattern driver 80 which regulates the write rate or speed of the various tips which are writing the various patterns into the resist 22. As a result, the system 20 provides for regulating resist temperature in-situ in a dynamic fashion, thereby substantially improving the accuracy of feature CDs and alignment.

Various types of pattern drivers may be utilized and each type of patten driver is contemplated as falling within the scope of the present invention. According to one exemplary embodiment, the pattern driver 80 includes a pattern controller and a memory which stores scan data which indicates a position or sequence of positions of the tip 83 in the X and Y directions in a plane of the imaging layer (the resist 22). The scan data is output to an X and Y direction servo controller which receives a detected signal from an X and Y position sensor which indicates the present position of the tip 83 relative to the X and Y directions. The X and Y direction servo controller compares the detected signal with the scan data and outputs a result signal based on this comparison. The result signal is output to an X and Y direction positioner which is electromechanically coupled to a stage which holds the substrate 26. Based on the result signal, the X and Y direction positioner moves the substrate 26 in the X and Y directions to control a position of the tip 83 relative to the imaging layer (resist) in the X and Y directions.

The pattern driver also stores pattern data in association with the scan data. In conjunction with the output of scan data, pattern data associated with the scan data is output from the scan and pattern controller to a voltage or current generator associated with the SPM 84. Based on the pattern data, the voltage and/or current generator is either activated or deactivated. When activated, the voltage and/or current generator generates a voltage and/or current and applies it to the tip 83 to affect the physical change in the resist 22 (i.e., exposure). Although the above description is one exemplary way of performing the pattern driving function, various techniques are available and may be employed to carry out the above function and each such technique is contemplated as falling within the scope of the present invention.

Figure 2:
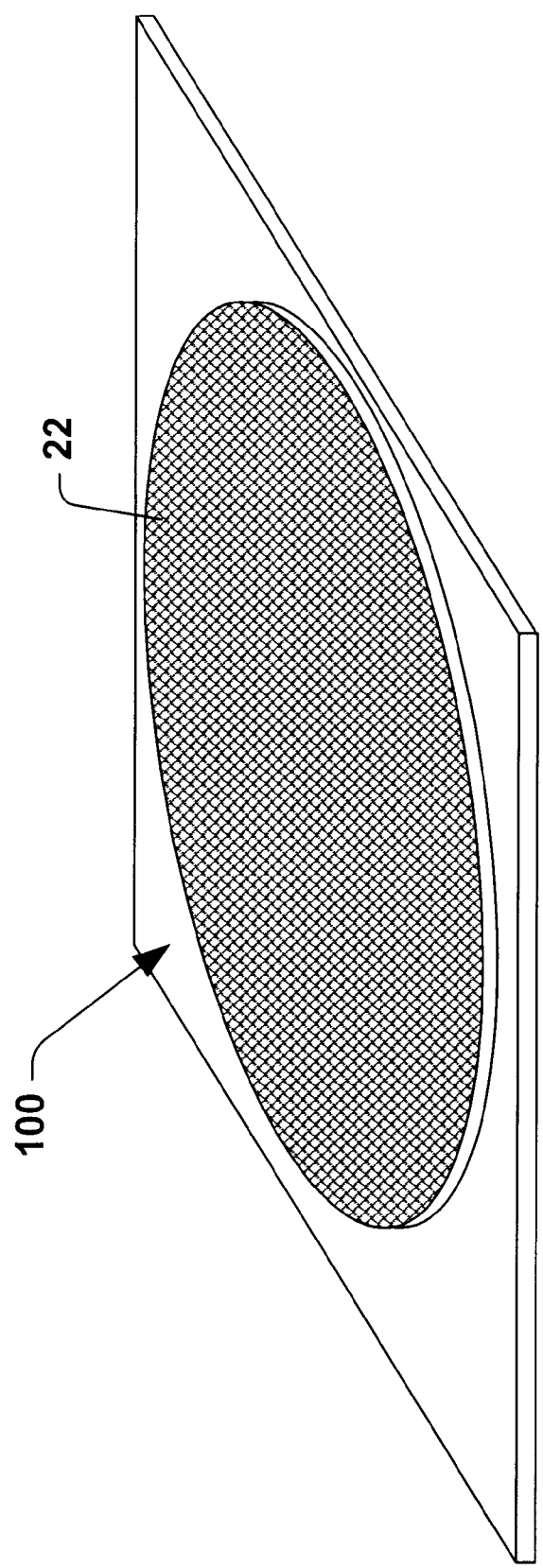
FIG. 2 is a perspective illustration of a substrate having a doped photoresist formed thereon, wherein the resist has been mapped with a grid in accordance with the present invention.
Figure 3:
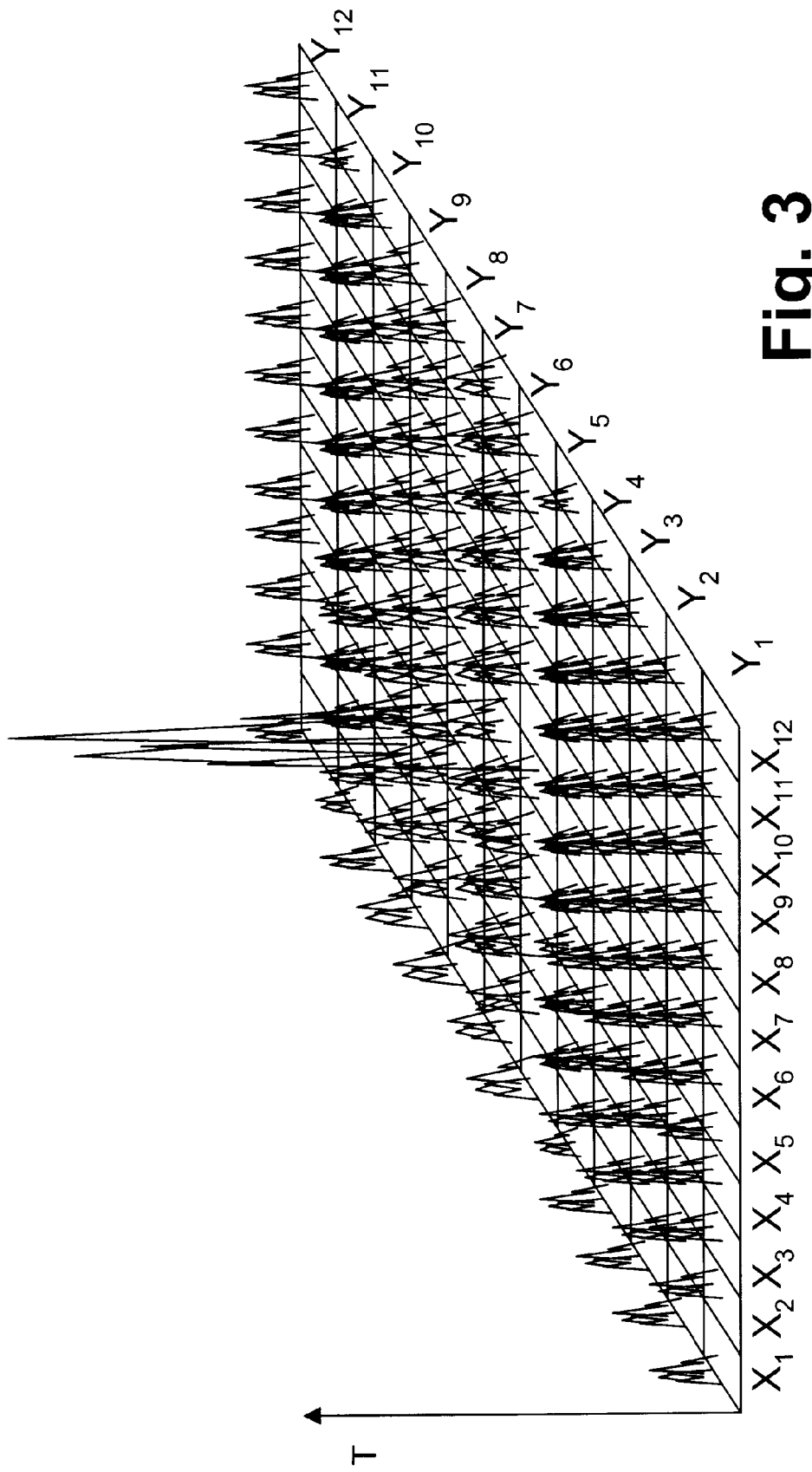
FIG. 3 is a representative three-dimensional grid map of a photoresist illustrating temperature amplitudes taken at grid blocks of the grid map in accordance with the present invention.

The system 20 is operable to monitor and dynamically regulate the resist temperature in the following exemplary fashion, as will be described in conjunction with FIGS. 2–4. According to this example, a plurality of tips 83 are employed in a massively parallel maskless lithography system to generate patterns at a plurality of locations in the resist 22 in a time-efficient manner. Accordingly, the resist 22 preferably is mapped by the controller 60 into a grid 100 as illustrated in FIG. 2, wherein each portion of the grid 100 corresponds to an XY position. Depending on the desired system resolution, the number of XY locations on the grid 100 may vary as desired. It should be understood, however, that the present invention is equally application to systems employing only a single writing tool.

Each of the tips 83 are separately driven by the pattern driver 80 associated with the SPM 84. That is, each cantilever arm 82 and associated tip 83 is controlled to write a specified pattern at a specified write rate. One or more of a plurality of light sources 40 then irradiates various portions $(X_i, Y_j) \ldots (X_m, Y_n)$ of the resist 22 which causes the fluorophores within the doped resist 22 to produce light 44b (fluorescence), having a magnitude or wavelength which is a function of the resist temperature thereat $F(X_i, Y_j) \ldots F(X_m, Y_n)$. The fluorescence 44b is detected by, for example, a photodetector or spectrometer 44 associated with the measuring system 50 and converted into data, for example, analog signals which represent the fluorescence magnitudes or wavelengths at the various locations. Preferably, the analog signals are converted into digital data using, for example, an analog to digital (A/D) converter, which are then transmitted to the controller 60 for further processing. The controller 60 converts the fluorescence magnitude or wavelength data into temperature data $T(X_i, Y_j) \ldots T(X_m, Y_n)$ according to its programming to generate, for example, a temperature profile across a plurality of locations on the resist 22, as illustrated in FIG. 3.

Upon identifying the resist temperature at various locations, the controller 60 then preferably compares the resist temperature at each location to one or more predetermined temperature thresholds. For example, if the temperature at a location $(X_i, Y_j)$ is greater than a lower threshold $T_L$ and less than an upper threshold $T_H$, then the resist temperature at that location is within an acceptable range and the controller 60 labels that location $(X_i, Y_j)$ as acceptable $(T_A)$. If, however, the temperature at the location falls below or exceeds the respective thresholds, the controller 60 identifies the temperature as too high $T_{UH}$ or too low $T_{UL}$.

Figure 4:
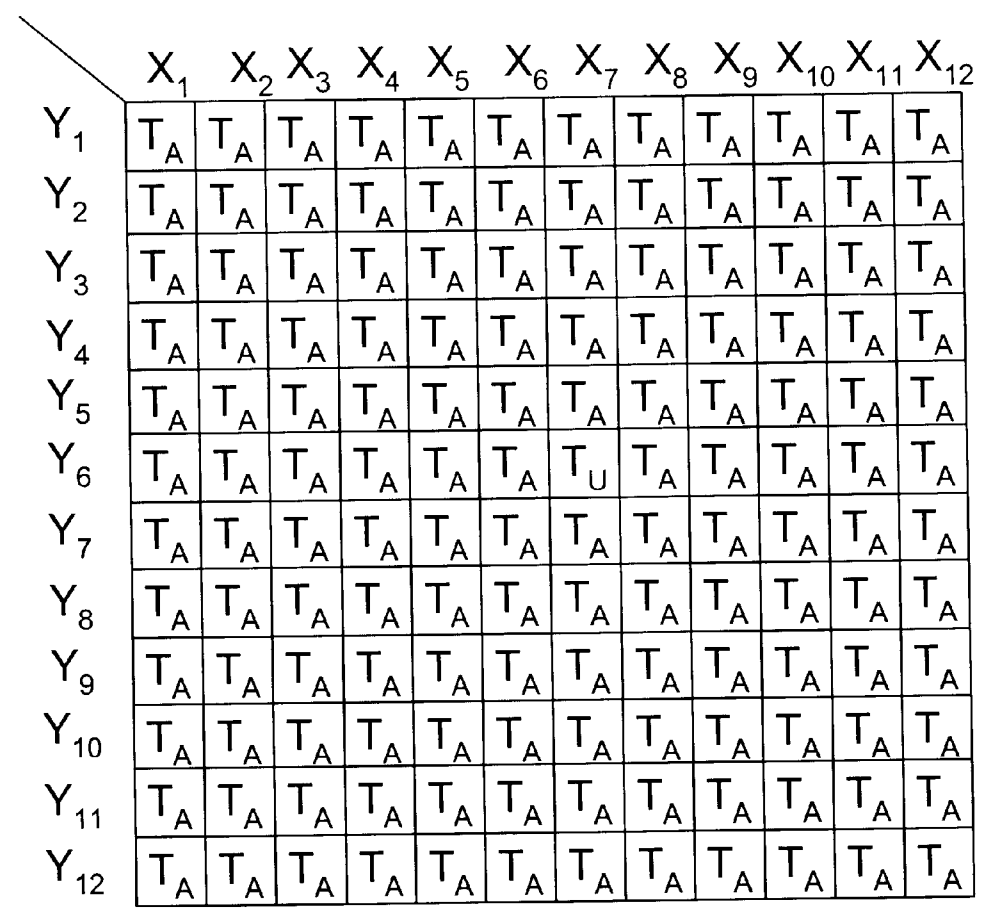

The controller 60 thereby generates a mapping as illustrated in FIG. 4 which indicates the status of the resist temperature, which is then converted into control instructions and transmitted to the pattern driver 80.

The pattern driver 80 receives the control instructions from the controller 60 and either maintains the present write rate, increases the write rate or decreases the write rate of the various writing tools in accordance with the instructions. For example, if the temperature at $(X_7, Y_6)$ is too high, the write rate of the writing tool which is forming a pattern at that location is reduced in order to reduce the resist temperature thereat. Please note that multiple writing tools may be generating pattens within a single location depending upon the selected grid resolution and the present invention contemplates various options where a control instruction can be sent to modify either one or more of such writing tools, as may be desired. In addition, a fixed incremental change in the write rate (either an increase or a decrease) may be used or the processor 60 may alter the write rate by an amount which is a function of the actual temperature measured and each such technique is contemplated as falling within the scope of the present invention.

Figure 1B:
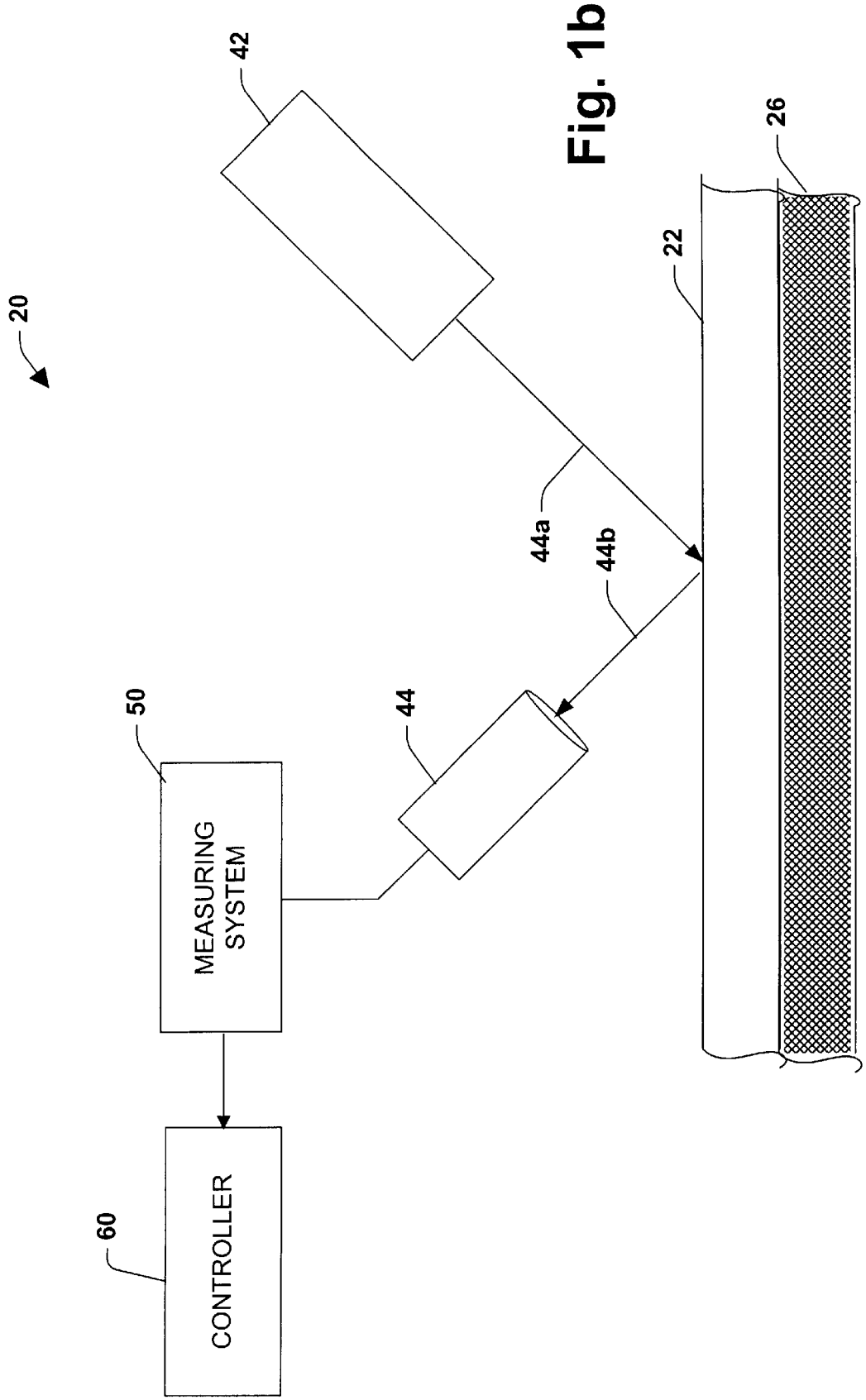
FIG. 1b is a partial schematic block diagram of the system of FIG. 1a being employed in connection with determining photoresist temperature by fluorescence from a doped film underlying the photoresist in accordance with another exemplary embodiment of the present invention.

FIG. 1b illustrates the system 20 being used in accordance with an alternative embodiment of the present invention. In FIG. 1b, the resist 22 overlies a film 26 such as a substrate, polysilicon film, oxide film, etc. in a manner similar to FIG. 1a. In FIG. 1b, however, the resist 22 is not doped with a material that experiences a transformation over temperature changes (such as the exemplary fluorophores), rather the underlying film 26 is doped in such a manner. Since the film 26 is in thermal contact with the overlying resist 22, an irradiation from the excitation source 40 generates fluorescence 44b from the film 26 which can then be detected by the detector 44 associated with the measuring system 50. Likewise, the invention contemplates also using a doped film that overlies the resist 22. Please note that because a temperature gradient may exist and the intensity or wavelength of the fluorescence 44b may differ based on the change, the controller 60 may require a different correlation algorithm to accurately identify the resist temperature in such embodiments.

Figure 5:
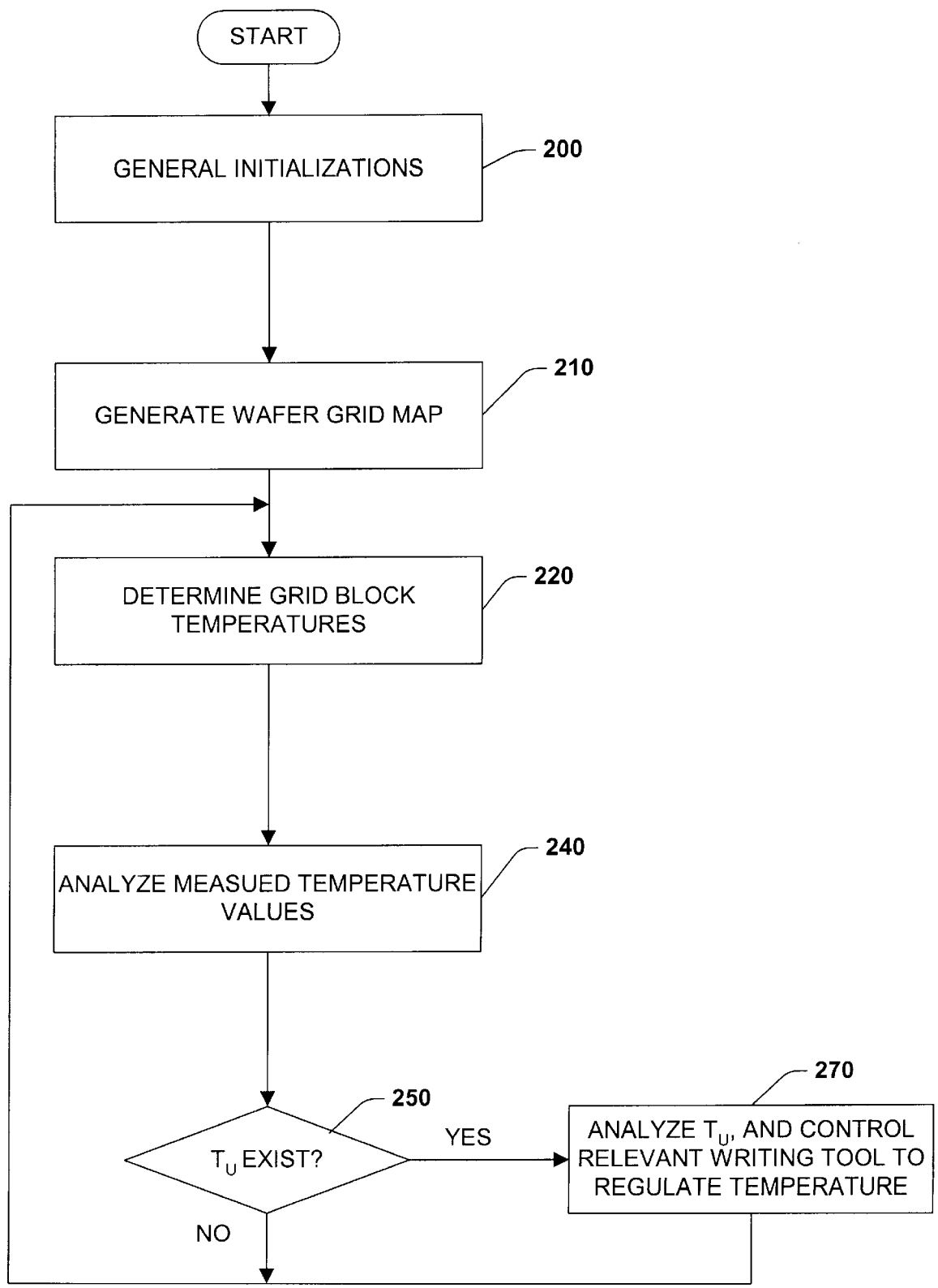
FIG. 5 is a flow chart diagram illustrating one exemplary methodology for carrying out the present invention.

FIG. 5 is a flow chart diagram illustrating one particular methodology for carrying out the present invention. In step 200, the processor 60 performs general initializations to the maskless lithography system 20. In step 210, the processor 60 maps at least a portion of the resist 22 into a plurality of grid blocks "XY". In step 220, temperature determinations are made by the processor 60 with respect to the various resist portions mapped by the respective grid blocks XY. The processor 60 then analyzes the determined temperature values against a table of acceptable temperature levels or various predetermined temperature thresholds for the respective portions of the resist 22. In step 250, the processor 60 determines if any grid block temperature values are not acceptable. If all values grid block temperature values are acceptable (NO at step 250), the processor 60 ends this particular iteration of the present methodology and returns to step 220 to perform another iteration. If unacceptable temperature values are found for any of the grid blocks (YES), the processor 60 advances to step 270 where the unacceptable temperature values are analyzed. After the analyses, the processor 60 transmits the appropriate control instructions to the pattern driver 80 to alter the write rate of one or more writing tools associated with grid blocks having an unacceptable resist temperature and thereby maintain the resist temperature within an acceptable temperature range throughout the pattern generation process.

Figure 6:
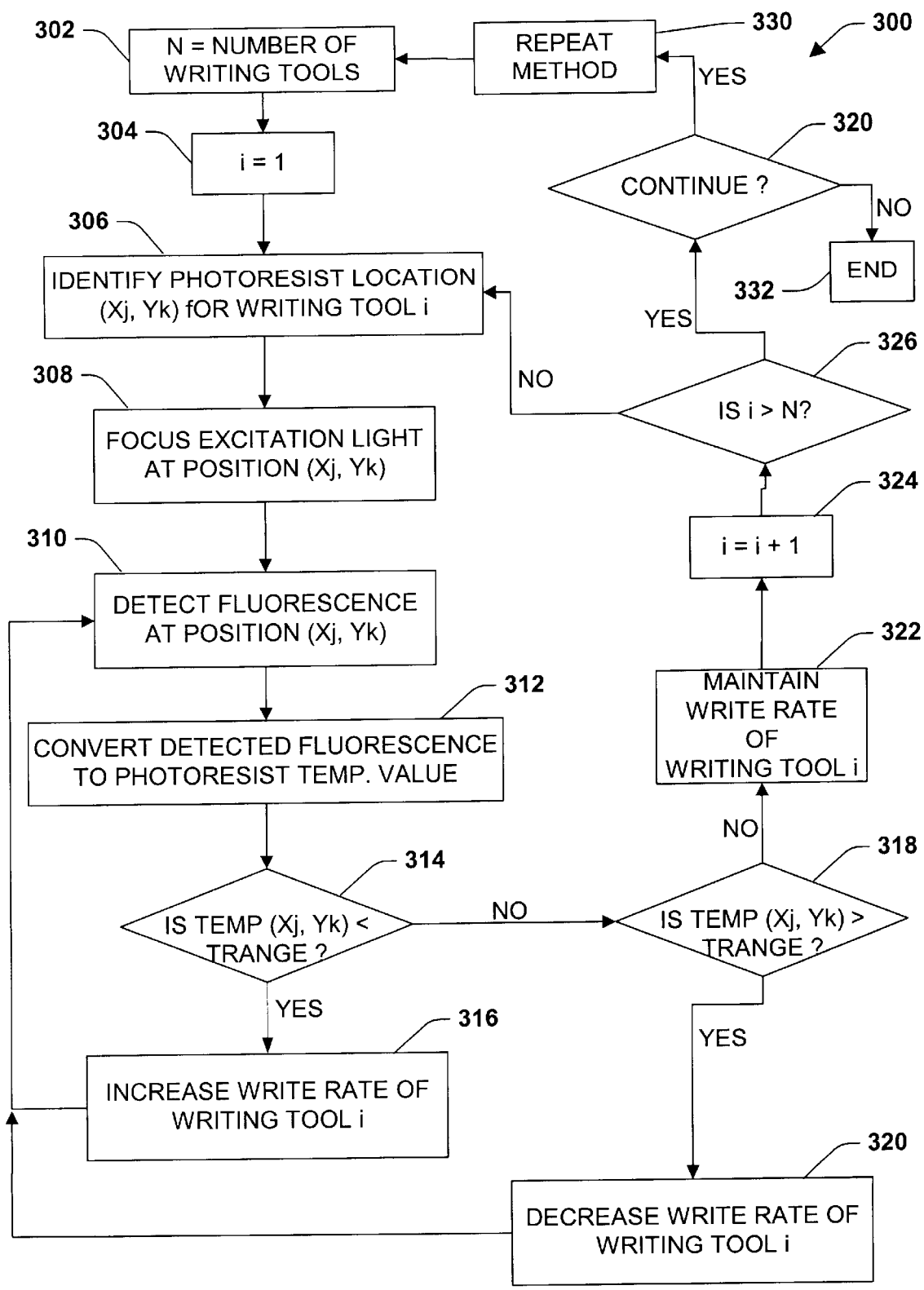
FIG. 6 is a flow chart diagram illustrating in greater detail another exemplary methodology for carrying out the present invention.

A more detailed exemplary method 300 that follows the basic methodology of FIG. 5 is illustrated in FIG. 6. During the general initialization step 200 performed by the processor or controller 60, the processor 60 identifies the total number of writing tools (N) being employed within the maskless lithography system 20 at step 302 and sets a variable (i) (representing which of the writing tools is being controlled) to "1" at step 304. Once the wafer grid map 100 of the resist 22 is established by the processor 60 at step 210, the processor 60 identifies the photoresist location ($X_j$, $Y_k$) for the writing tool i at step 306 and controls the excitation source 40 to ensure that region ($X_j$, $Y_k$) is properly irradiated at step 308.

Once the resist 22 (which is doped or a nearby film is doped) is irradiated by the excitation source 40, the property of interest that varies with respect to temperature (preferably fluorescence magnitude or wavelength 44b) is detected and measured by the measuring system 50 at step 310. The fluorescence 44b is then converted (preferably in the measuring system 50, but may be performed by the processor 60) to a photoresist temperature value for the region ($X_j$, $Y_k$) at step 312. The processor 60 takes the resist temperature value $T(X_j, Y_k)$ and analyzes the data at step 314 by comparing it to an acceptable temperature range or set of thresholds ($T_{RANGE}$).

If the processor 60 determines that the detected temperature $T(X_j, Y_k)$ falls below the acceptable range at step 314 (YES), the processor 60 transmits a control instruction to the pattern driver 80 at step 316 to increase the write rate of the writing tool i, thereby minimizes temperature variations across the resist 22 while simultaneously increasing the time-efficiency of the system 20 without negatively impacting the pattern resolution in the resist 22. If, however, the processor 60 determines that the detected temperature $T(X_j, Y_k)$ is above the acceptable temperature range ($T_{RANGE}$) at step 318, the processor 60 transmits a control instruction to the pattern driver 80 at step 320 to decrease the write rate of the writing tool i to reduce the resist temperature down to an acceptable level and thus improve the pattern resolution.

In the event that the resist temperature at position ($X_j$, $Y_k$) is within the acceptable range (NO at step 318), the write rate of the writing tool i is maintained at step 322 and the processor 60 continues its analysis going to the next writing tool at step 324. At step 326, the processor 60 checks whether all the writing tools have been analyzed and if not (NO at step 326), the method 300 continues back to step 306 and the resist location ($X_j$, $Y_k$) at which the next writing tool is identified and the method 300 is repeated. If, however, all the writing tools have been analyzed (YES at step 326), the processor 60 may repeat the process at steps 328 and 330 or may end at steps 328 and 332.

The above method 300 merely provides one exemplary way of carrying out the method of the present invention. Other iterations or options may also be included and are contemplated as falling within the scope of the present invention. For example, the processor 60 may evaluate multiple writing tools in parallel instead of one at a time. Alternatively, instead of the excitation source 40 focusing solely on individual resist regions and being positionally controlled by the processor 60, the system 20 may employ a global irradiation source 40 that irradiates multiple positions or even the entire resist 22 at one time.

The present invention also contemplates being used as a mask writing calibration methodology, wherein an optimum (or at least an acceptable) write control algorithm can be identified to ensure that the write rate of one or more writing tools maintains the resist temperature within an acceptable temperature range during the pattern transfer process. For example, a test wafer (or mask substrate if being used to create a mask) may be utilized having an exemplary resist from thereon (having a material such as a temperature sensitive fluorophore associated therewith). One or more writing tools used to generate a give pattern in the resist are controlled with a preliminary writing tool(s) control algorithm, wherein the one or more tools are controlled spatially to generate the pattern of interest, and also controlled with regard to their write rate. That is, each tool is scanning a portion of the resist at a predetermined write rate.

As the pattern transfer process is initiated, each of the one or more writing tools writes its portion of the pattern according to the control routine as quickly as possible, while the resist temperature detection process (described supra) is conducted. As the temperature at various portions of the resist falls below or exceeds an acceptable temperature range, the writing control routine is dynamically modified and the acceptable write rate at each position for each of the one or more writing tools is stored in a memory associated with the controller. Such a process may be performed iteratively to further optimize a writing tool control routine, as may be desired. After the pattern transfer process is complete, an optimized control routine which maintains the resist within an acceptable temperature range is established. Such a routine may then be used in conjunction with a pattern transfer process that does not utilize a resist having a material such as a fluorophore associated therewith. Consequently, the control routine then may be used with a standard, conventional type resist process, as may be desired.

In addition, although the present invention discussed a material such as a fluorophore associated with the preferred embodiment of the present invention, it should be understood that other types of materials may be used and are contemplated as falling within the scope of the present invention. For example, the material may include one or more thermocouples (preferably many) may be formed on a film or substrate under the resist during a pattern transfer process, wherein the thermocouples detect the resist temperature during a pattern transfer process and feed such thermal information back to the controller for dynamic control of the one or more writing tools. Similar to that described above, such a material may be used to generate a pattern transfer control routine which then may be used to transfer a pattern to a film in a conventional manner.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A system for monitoring and regulating a photoresist temperature in conjunction with a maskless lithography pattern transfer process, comprising:
    a photoresist layer overlying a substrate;
    a material associated with the photoresist layer, wherein the material exhibits a characteristic which varies over variations in temperature;
    a detection system for detecting the material characteristic; and
    a processor operatively coupled to the detection system, the processor configured to receive information associated with the detected characteristic and use the information to control a tool being used for the pattern transfer process.

2. The system of claim 1, wherein the material is in the photoresist layer.

3. The system of claim 1, wherein the material is below the photoresist layer.

4. The system of claim 1, wherein the material overlies the photoresist layer.

5. The system of claim 1, wherein the material comprises a temperature sensitive fluorophore.

6. The system of claim 5, wherein the characteristic is a fluorescence having a wavelength that varies with respect to changes in temperature.

7. The system of claim 6, wherein the fluorophore comprises europium chelate.

8. The system of claim 5, wherein the characteristic is fluorescence having an intensity that varies with respect to changes in temperature.

9. The system of claim 1, wherein the detection system comprises:
    a detector which senses the material characteristic; and
    a measuring system operatively coupled to the detector, wherein the measuring system converts the detected material characteristic into a data form for processing by the processor.

10. The system of claim 9, wherein the measuring system comprises an analog to digital converter.

11. The system of claim 9, wherein the detector comprises a spectrometer.

12. The system of claim 9, wherein the detector comprises a photodetector.

13. The system of claim 1, wherein the processor is further configured to determine a temperature at a portion of the photoresist layer based on the detected characteristic.

14. The system of claim 13, wherein the processor is further configured to compare the temperature to an acceptable temperature range and generate control instructions based on the comparison, wherein the control instructions are used to control the tool being used for the pattern transfer process.

15. The system of claim 14, wherein the control instructions dictate a write rate for the tool being used for the pattern transfer process.

16. The system of claim 1, wherein the tool being used for the pattern transfer process is selected from the group consisting of an ion beam lithography tool, an electron beam lithography tool, a scanning tunneling microscope, a scanning force microscope, an atomic force microscope and a scanning probe microscope.

17. The system of claim 1, further comprising a pattern driver associated with the processor and the tool, wherein the pattern driver receives control instructions from the process and controls a position and a write rate of the tool in response to the control instructions.

18. The system of claim 12, further comprising an excitation source for triggering the characteristic which varies over variations in temperature.

19. The system of claim 1, wherein the maskless lithography pattern transfer process is used to fabricate a mask or a semiconductor patterned wafer.

20. A system for monitoring and regulating a photoresist temperature in conjunction with a maskless lithography pattern transfer process, comprising:
    a photoresist layer overlying a substrate;
    a material associated with the photoresist layer, wherein the material exhibits a characteristic which varies over variations in temperature;
    a detection and measuring system which detects the material characteristic and converts the characteristic into an electrical signal;
    a processor operatively coupled to the detection and measuring system, wherein the processor is configured to receive the electrical signal, analyze the electrical signal, and generate a control instruction in response thereto; and
    a maskless lithography writing tool operatively coupled to the process, wherein the writing tool operates in accordance with the control instruction.

21. The system of claim 20, wherein the material comprises a temperature sensitive fluorophore which provides fluorescence in response to being excited by an excitation source.

22. The system of claim 20, wherein the electric signal represents a parameter that correlates to a temperature of a portion of the photoresist layer.

23. The system of claim 20, wherein the processor is further configured to determine a temperature of a portion the photoresist layer based on the electrical signal and generate the control instruction based on the determined temperature, wherein the control instruction alters a write rate of the writing tool if the determined temperature is outside of a predetermined range to thereby dynamically regulate the temperature of the photoresist layer.

24. A method of monitoring and regulating a photoresist temperature in conjunction with a maskless lithography pattern transfer process, comprising the steps of:
  associating a material having a characteristic which varies over variations in temperature with a photoresist layer which overlies a substrate;
  detecting the characteristic during the pattern transfer process;
  determining a temperature of a portion of the photoresist layer using the detected characteristic; and
  controlling an operation of a writing tool which performs the pattern transfer process in response to the photoresist layer temperature.

25. The method of claim 24, wherein associating the material with the photoresist layer comprises doping the photoresist layer with the material.

26. The method of claim 24, wherein associating the material with the photoresist layer comprises depositing the material under the photoresist layer.

27. The method of claim 24, wherein associating the material with the photoresist layer comprises depositing the material over the photoresist layer.

28. The method of claim 24, wherein the material comprises a temperature sensitive fluorophore and detecting the characteristic comprises:
  irradiating the fluorophore; and
  sensing the fluorescence, wherein the fluorescence is a function of the photoresist temperature.

29. The method of claim 28, wherein a wavelength of the fluorescence is a function of the photoresist temperature.

30. The method of claim 28, wherein an intensity of the fluorescence is a function of the photoresist temperature.

31. The method of claim 24, wherein determining the photoresist temperature comprises calculating the photoresist temperature using a correlation algorithm which correlates the characteristic to the photoresist temperature.

32. The method of claim 24, wherein the material is a temperature sensitive fluorophore and wherein detecting the characteristic and determining the photoresist temperature comprises:
  sensing a wavelength of a fluorescence caused by the temperature sensitive fluorophore, wherein the fluorescence wavelength is a function of the photoresist temperature; and
  correlating the fluorescence wavelength to the photoresist temperature using a correlation algorithm.

33. The method of claim 24, wherein the material is a temperature sensitive fluorophore and wherein detecting the characteristic and determining the photoresist temperature comprises:
  sensing an intensity of a fluorescence caused by the temperature sensitive fluorophore, wherein the fluorescence intensity is a function of the photoresist temperature; and
  correlating the fluorescence intensity to the photoresist temperature using a correlation algorithm.

34. The method of claim 24, wherein controlling the operation of the writing tool comprises:
  generating a control instruction in response to the determined photoresist temperature; and
  transmitting the control instruction to the writing tool, wherein the control instruction controls a write rate of the writing tool.

35. The method of claim 34, wherein when the determined photoresist temperature exceeds a predetermined temperature, the generated control instruction reduces a write rate of the writing tool, thereby reducing the generation of heat in a portion of the photoresist layer during the pattern transfer process.

36. The method of claim 34, wherein when the determined photoresist temperature is less than a predetermined temperature, the generated control instruction increases a write rate of the writing thereby increasing the generation of heat in a portion of the photoresist layer during the pattern transfer process.

37. A method of monitoring and regulating a photoresist temperature in conjunction with a maskless lithography pattern transfer process, comprising the steps of:
  associating a material having a characteristic which varies over variations in temperature with a photoresist layer which overlies a substrate;
  initiating a pattern transfer process using a preliminary control routine having a default write rate for one or more writing tools;
  detecting the characteristic during the pattern transfer process;
  determining a temperature of a portion of the photoresist layer using the detected characteristic;
  modifying the default write rate of at least one of the one or more writing tools at one or more locations about the photoresist in response to the determined temperature to maintain the photoresist temperature within a predetermined temperature range; and
  storing the modified default rate data in a memory, wherein the modified write rate data is used in conjunction with portions of the preliminary control routine to generate the control routine.

* * * * *

UNITED STATES PATENT AND TRADEMARK OFFICE
CERTIFICATE OF CORRECTION

PATENT NO. : 6,238,830 B1  
DATED : May 29, 2001  
INVENTOR(S) : Bharath Rangarajan, Michael K. Templeton and Bhanwar Singh It is certified that error appears in the above-identified patent and that said Letters Patent is hereby corrected as shown below:

Title page,
Title: ACTIVE CONTROL OF TEMPERATURE IN SCANNING PROBE LITHOGRAPHY AND MASKLESS LITHOGRAPHY Column 1,
Line 21, please replace the word "comers" with -- corners --.

Column 2,
Line 38, please replace the phrase "is schematic" with the phrase -- is a schematic --.

Column 7,
Line 19, please replace the word "patten" with -- pattern --.

Column 8,
Line 44, please replace the word "pattens" with -- patterns --.

Column 14,
Line 25, please replace the phrase "writing thereby" with the phrase -- writing tool, thereby --.

Signed and Sealed this

Thirteenth Day of November, 2001

Attest:

*Nicholas P. Godici*

NICHOLAS P. GODICI  
*Attesting Officer*  *Acting Director of the United States Patent and Trademark Office*